(12) United States Patent
Knapp et al.

(10) Patent No.: US 7,715,211 B2
(45) Date of Patent: May 11, 2010

(54) CONFIGURABLE PRINTED CIRCUIT BOARD

(75) Inventors: Lawrence R. Knapp, West Chicago, IL (US); Charles D. Cosner, Romeoville, IL (US); Karl B. Randall, Lockport, IL (US); Steven A. Everly, Tinley Park, IL (US)

(73) Assignee: Tellabs Operations, Inc., Naperville, IL (US)

( * ) Notice: Subject to any disclaimer, the term of this patent is extended or adjusted under 35 U.S.C. 154(b) by 282 days.

(21) Appl. No.: 11/778,903

(22) Filed: Jul. 17, 2007

(65) Prior Publication Data

US 2009/0023309 A1    Jan. 22, 2009

(51) Int. Cl.
*H05K 7/02*      (2006.01)
(52) U.S. Cl. .................. 361/807; 361/810
(58) Field of Classification Search ............ 361/600, 361/679, 807–810, 760, 748, 720, 736
See application file for complete search history.

(56) References Cited

U.S. PATENT DOCUMENTS

| | | | | |
|---|---|---|---|---|
| 5,886,875 A | * | 3/1999 | Phelps et al. ............... | 361/752 |
| 6,665,170 B1 | * | 12/2003 | Warner et al. ............... | 362/317 |
| 6,762,942 B1 | * | 7/2004 | Smith ......................... | 361/749 |
| 6,867,367 B2 | * | 3/2005 | Zimmerman ................ | 174/528 |
| 2002/0076189 A1 | * | 6/2002 | McMullin et al. ........... | 385/137 |
| 2008/0074854 A1 | * | 3/2008 | Batcheller et al. .......... | 361/752 |

* cited by examiner

*Primary Examiner*—Hung S Bui
(74) *Attorney, Agent, or Firm*—Fitzpatrick, Cella, Harper & Scinto

(57) ABSTRACT

According to an example embodiment of the invention, a configurable printed circuit board (PCB) includes one or more separable portions for supporting modules for interfacing with the PCB. The separable portions extend from an edge portion of a main body of the PCB, and are disposed between the main body of the PCB and a protective portion. A scored portion is provided at a boundary between the main body of the PCB and the separable portions, the separable portions being separable by being broken off from the main body of the PCB at the scored portion. According to an example embodiment of the invention, a method of configuring a PCB having one or more separable portions of the PCB includes securing the PCB and separating the one or more separable portions of the PCB from another portion of the PCB.

21 Claims, 6 Drawing Sheets

US 7,715,211 B2

1

CONFIGURABLE PRINTED CIRCUIT BOARD

BACKGROUND OF THE INVENTION

1. Field of the Invention

This invention generally relates to a configurable printed circuit board and, more particularly, to a printed circuit board having separable portions for supporting a desired number of modules that interface with the printed circuit board.

2. Description of the Related Art

For many applications, it is desired to have a printed circuit board (PCB) interface with another device. For example, it is increasingly common to connect fiber optic networks to PCBs. The fiber optic connection is established by an optical port, or small form-factor physical interface (SFP), capable of converting optical signals to electrical signals and vice versa. Conventionally, PCBs have been provided with support portions, extending from the edge of the main body of the PCB, on which optical ports are mounted.

Different applications require PCBs to have connections with different numbers of optical ports. Accordingly, PCBs having different numbers of support portions are required. Conventionally, PCBs have been custom made for a particular application, that is, custom made to have the proper number of support portions for the required application.

Such customized production of PCBs requires increasing and/or complicating the manufacturing equipment and procedures, thus increasing the cost, time and difficulty of production. In addition, it reduces the extent to which the produced PCBs are adaptable to different applications.

Accordingly, it would be useful to be able to produce PCBs that are adaptable to different applications (e.g., PCBs capable of having a variable number of support portions) without having to resort to such a customized production method.

SUMMARY OF THE INVENTION

The present invention addresses the limitations discussed above.

According to an example aspect of the present invention, there is provided a printed circuit board including one or more separable portions of the printed circuit board.

According to an example embodiment of the present invention, the separable portions may, for example, extend from an edge portion of a main body of the printed circuit board, and be disposed between a main body of the printed circuit board and a protective portion.

According to an example embodiment of the present invention, the printed circuit board may include a scored portion at a boundary between a main body of the printed circuit board and the separable portions, the separable portions being separable by being broken off or otherwise detached from the main body of the printed circuit board at the scored portion.

According to an example embodiment of the present invention, the separable portions can support or have mounted thereon modules that can interface with the printed circuit board.

According to another example aspect of the present invention, there is provided a method of configuring a printed circuit board having one or more separable portions of the printed circuit board. The method includes securing a printed circuit board, and separating one or more separable portions of the printed circuit board from another portion of the printed circuit board. The method may also include providing a printed circuit board having separable portions of the printed circuit board, and providing a scored portion at which the one or more separable portions can be separated from the other portion of the printed circuit board.

A better understanding of these and other aspects, features, and advantages of the invention may be had by reference to the drawings and to the accompanying description, in which example embodiments of the invention are illustrated and described.

BRIEF DESCRIPTION OF THE DRAWINGS

Throughout the figures, like or corresponding reference numerals are used to identify like or corresponding parts.

DETAILED DESCRIPTION OF THE PREFERRED EMBODIMENTS

Figure 1:
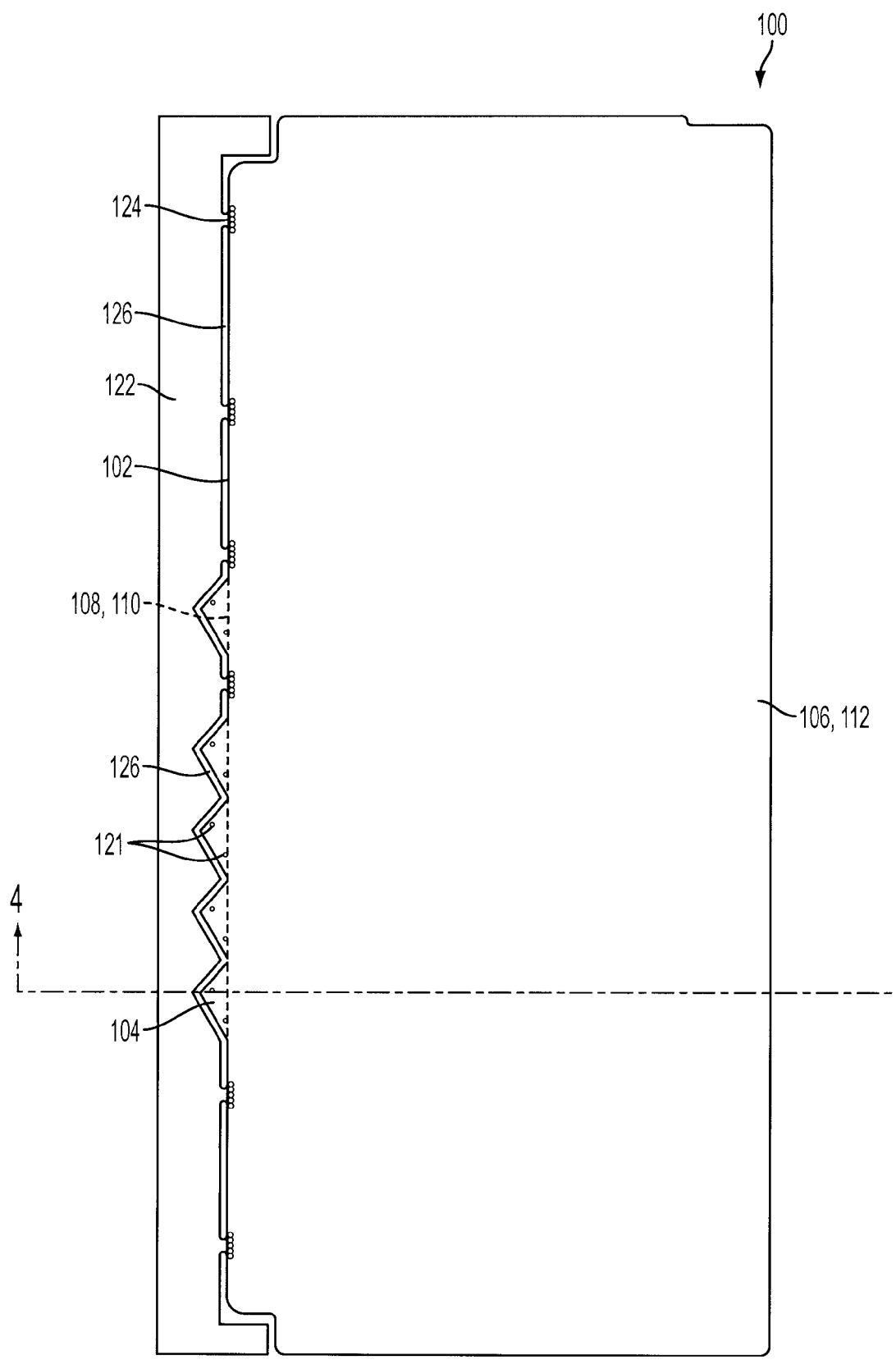
FIG. 1 is a plan view of a configurable PCB according to an example embodiment of the present invention.

An example embodiment of the present invention will be discussed with reference to the accompanying figures. FIG. 1 is a plan view of a configurable PCB 100 according to an example embodiment of the present invention. For purposes of simplification, PCB 100 is shown throughout the figures as a bare board, i.e., without any components thereon. PCB 100 has a main body 106 surrounded by a perimeter or edge (these terms being used interchangeably herein) 102. At the left side of edge 102 as shown in FIG. 1, five triangular-shaped break-away tabs 104 are provided on a portion of edge 102, the tabs 104 extending outward from main body 106 of PCB 100. Break-away tabs 104 may also be referred to as separable portions, removable portions, support portions, or any combination of such terms.

In example embodiments of the invention, the number, shape and location of tabs 104 may be varied. For example, the number of tabs 104 may range from one to as many as desired, as limited by the length of edge 102. The shape of tabs 104 may be other than triangular, e.g., the shape may be rectangular, square, trapezoidal, semi-circular, or other shapes, and not all tabs 104 need be the same shape. Tabs 104 may be located at other locations on edge 102. In addition, tabs 104 may be located adjoining one another, as is the case for the lower four tabs 104 as shown in FIG. 1, or as separated from one another, as is the case for the uppermost tab 104 with respect to the lower four tabs 104. Tabs 104 may be provided in any combination of adjoining tabs and separated tabs. Where tabs 104 are separated from each other, the spacing between tabs need not be in the amount as shown in FIG. 1.

Figure 2:
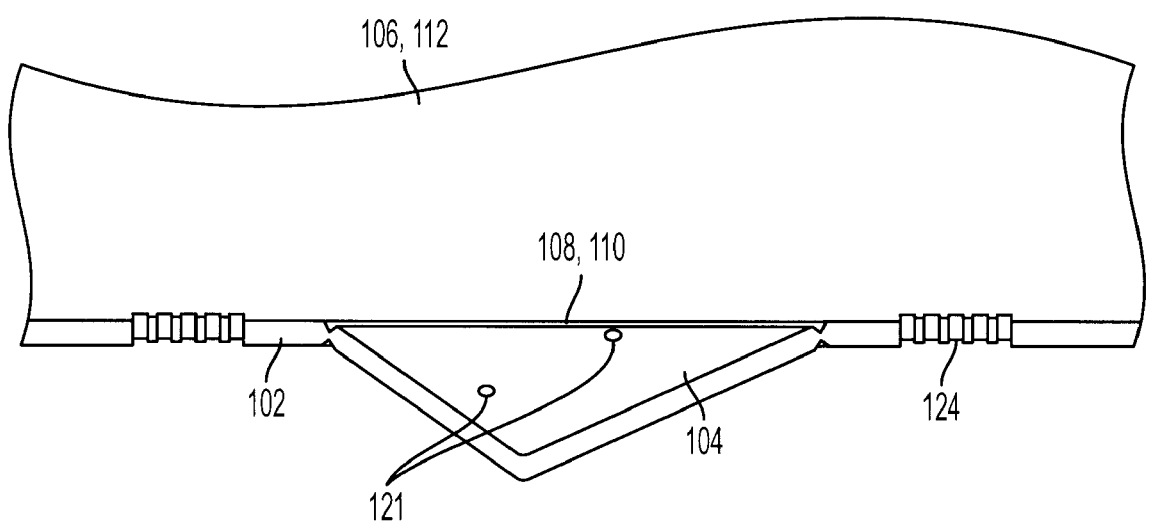
FIG. 2 is a perspective view showing a portion of the PCB of FIG. 1 including a separable portion and a score line between the separable portion and a main body of the PCB.

FIG. 2 is a perspective view showing a portion of PCB 100 of FIG. 1 including a single removable portion or tab 104 and a scored portion 108 between removable portion 104 and main body 106 of PCB 100. FIG. 2 provides a close-up view of tab 104 and an adjacent portion of scored portion 108 to facilitate understanding of these aspects of the invention. (Scored portion 108 is shown schematically in FIG. 1.)

Figure 3:
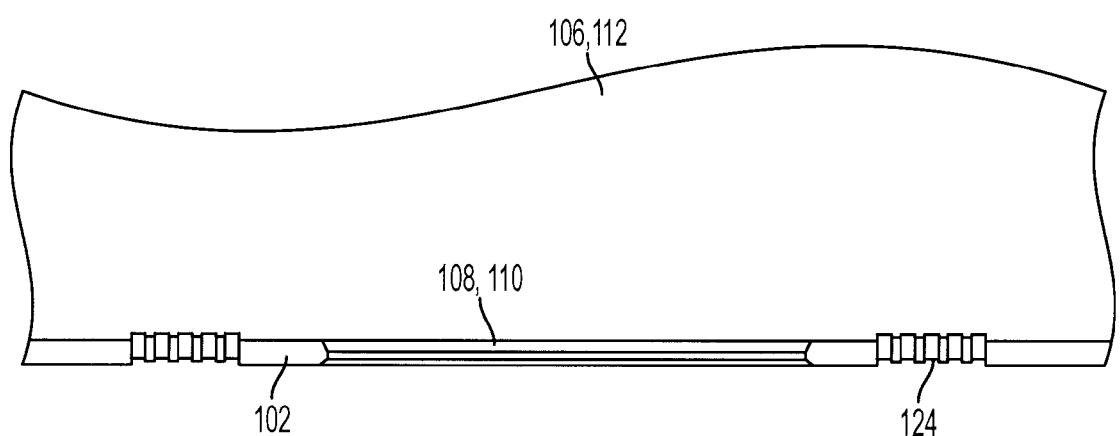
FIG. 3 is identical to FIG. 2, except that FIG. 3 shows the main body of the PCB after the separable portion has been separated.
Figure 6:
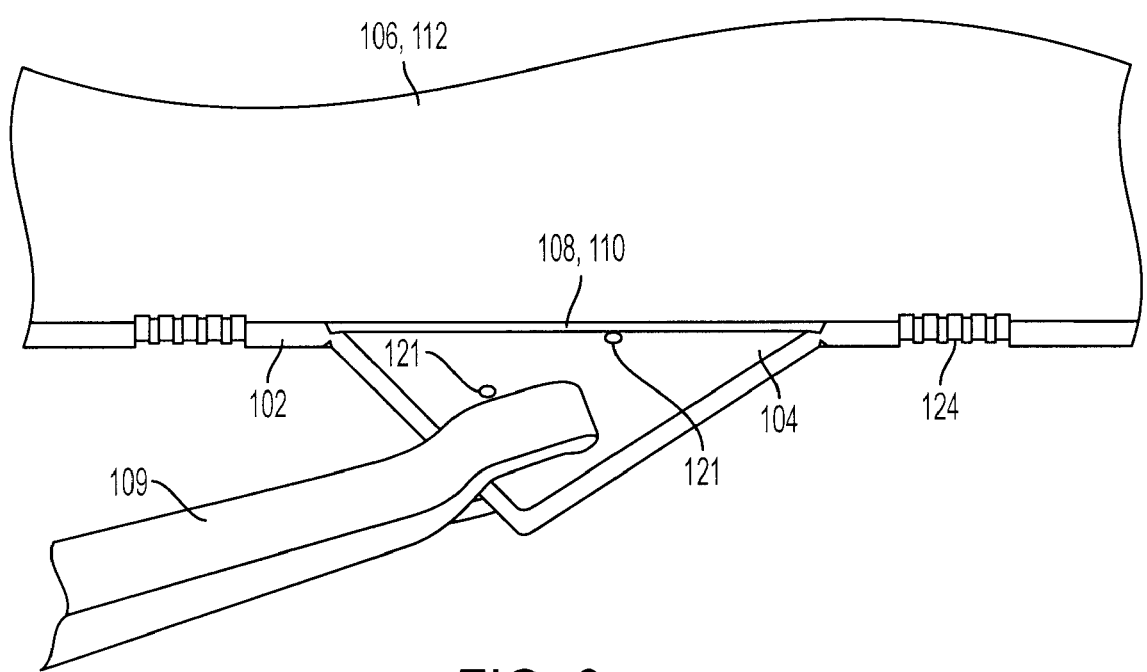
FIG. 6 is identical to FIG. 2, except that FIG. 6 shows the separable portion in the process of being separated from the main body of the PCB by use of a tool.

Tabs 104 may be formed as integral portions of PCB 100. (Thus, PCB 100 may be deemed to include both main body 106 and tabs 104.) As shown, e.g., in FIGS. 1 and 2, scored portion 108 (described in more detail below) is provided at boundary 110 between main body 106 and tabs 104 and extends the length of tabs 104. Scored portion 108 permits one to easily break tab 104 off from main body 106 of PCB 100 if desired, but is provided with a sufficient thickness to prevent tab 104 from being broken off, e.g., inadvertently, when it is desired to retain tab 104. According to an example embodiment of the invention, scored portion 108 may be designed so that tab 104 is easily broken off from main body 106 by use of a hand tool, such as by twisting tab 104 off with a pliers 109, as illustrated in FIG. 6. FIG. 6 is identical to FIG. 2, except that FIG. 6 shows removable portion 104 in the process of being removed from main body 106 of PCB 100 by use of pliers 109. Since removable portion 104 is in the process of being twisted off by pliers 109, removable portion 104 is shown as being bent downward in FIG. 6, in contrast to FIG. 2. FIG. 3 shows main body 106 of PCB 100 at a time after removable portion 104 has been removed. (FIG. 3 is also identical to FIG. 2, then, except that FIG. 3 shows main body 106 of PCB 100 after removable portion 104 has been removed.) According to another example embodiment of the invention, scored portion 108 may be designed such that tabs 104 are easily broken off by using a thumb and forefinger.

Figure 4:
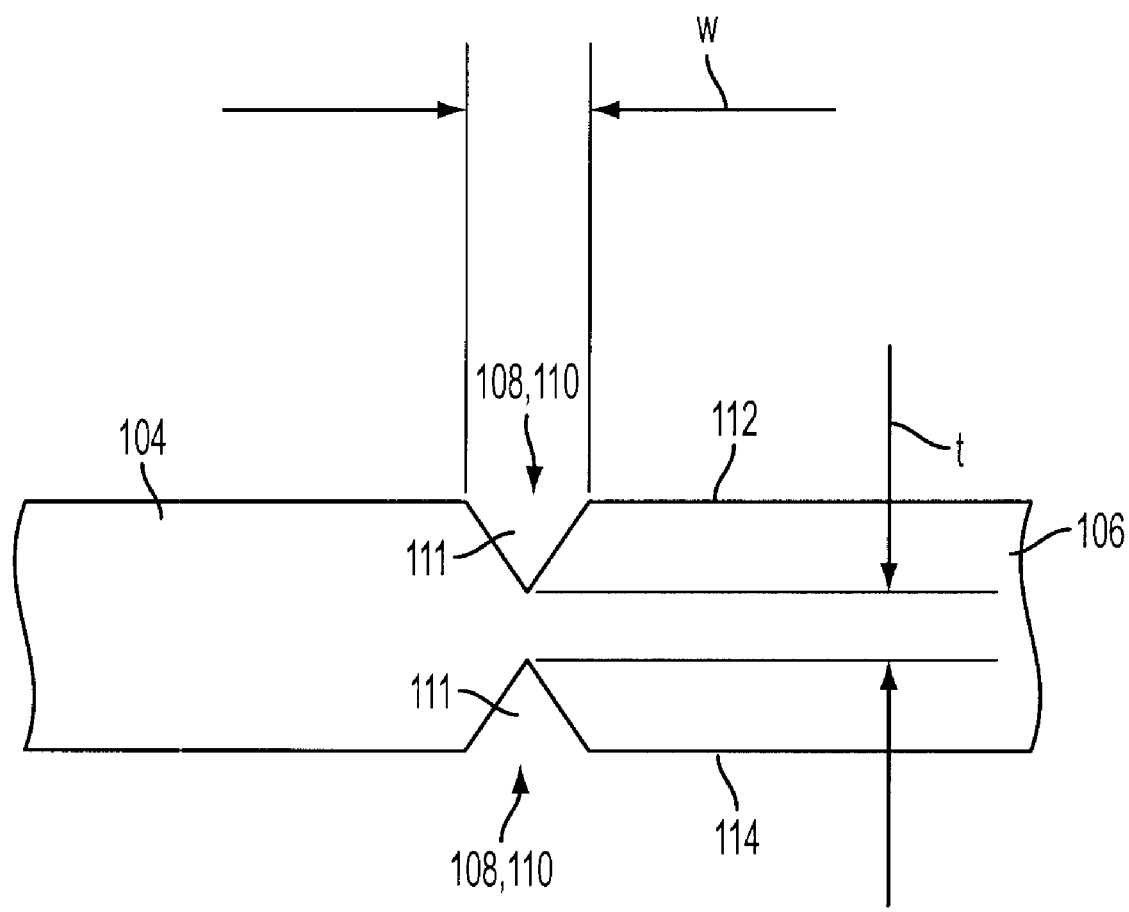
FIG. 4 is a fragmentary cross-sectional view of the PCB of FIG. 1 taken along the line 4-4 in FIG. 1, showing a score line between a separable portion and a main body of the PCB.

FIG. 4 is a cross-sectional view of a portion of PCB 100 of FIG. 1, showing scored portion 108 between removable portion 104 and main body 106 of PCB 100. FIG. 4 presents a more close-up view of scored portion 108 than does FIG. 2. According to an example embodiment of the invention, as shown in FIG. 4, scored portion 108 may be constituted by two score lines, which may be formed by making two V-shaped grooves 111, respectively, in PCB 100, one on an upper surface 112 of PCB 100 and one on a lower surface 114 of PCB 100. The thickness t and the width w of the scored portion may be adjusted so that an appropriate amount of force is required to break tab 104 off of main body 106. The amount of force should be sufficiently small so that when desired tab 104 can be broken off using a tool intended for that purpose without undue effort. The amount of force should be sufficiently large so that when it is desired to retain tab 104, tab 104 will not break off by force applied thereto, e.g., unintentionally, accidentally, etc. An example value of t is 0.010 inches ±0.2%. That is to say, the thickness of PCB 100 at scored portion (score lines) 108, i.e., the thickness of PCB 100 after the score lines are made therein, would be 0.010 inches ±0.2%. An example maximum value of w is 0.030 inches. That is to say, the width of scored portion (score line) 108 would be 0.030 inches at maximum.

The details of scored portion 108, such as its measurements, quantity, structure, the degree of strength with which it holds tabs 104 to main body 106 of PCB 100, and the intended mechanism for removing tab 104, may be varied, as will be appreciated by one of skill in the art in view of this description. Furthermore, it is not required to employ scored portion 108 as the mechanism for retaining and permitting removal of tabs 104. Rather, it is possible to employ other mechanisms to affix tabs 104 to main body 106 of PCB 100 and to remove tabs 104 from main body 106 of PCB 100, as will be appreciated by one of skill in the art in view of this description. For example, according to an example embodiment of the invention, one such alternative mechanism would be to affix tabs 104 to main body 106 of PCB 100 by simply forming main body 106 and tabs 104 as a single integral piece without providing a scored portion 108 and to remove tabs 104 from main body 106 by using a PCB cutting tool to cut tabs 104 off of main body 106 of PCB 100. According to another example embodiment of the invention, another alternative mechanism would be to use a perforated line instead of scored portion 108.

Figure 5:
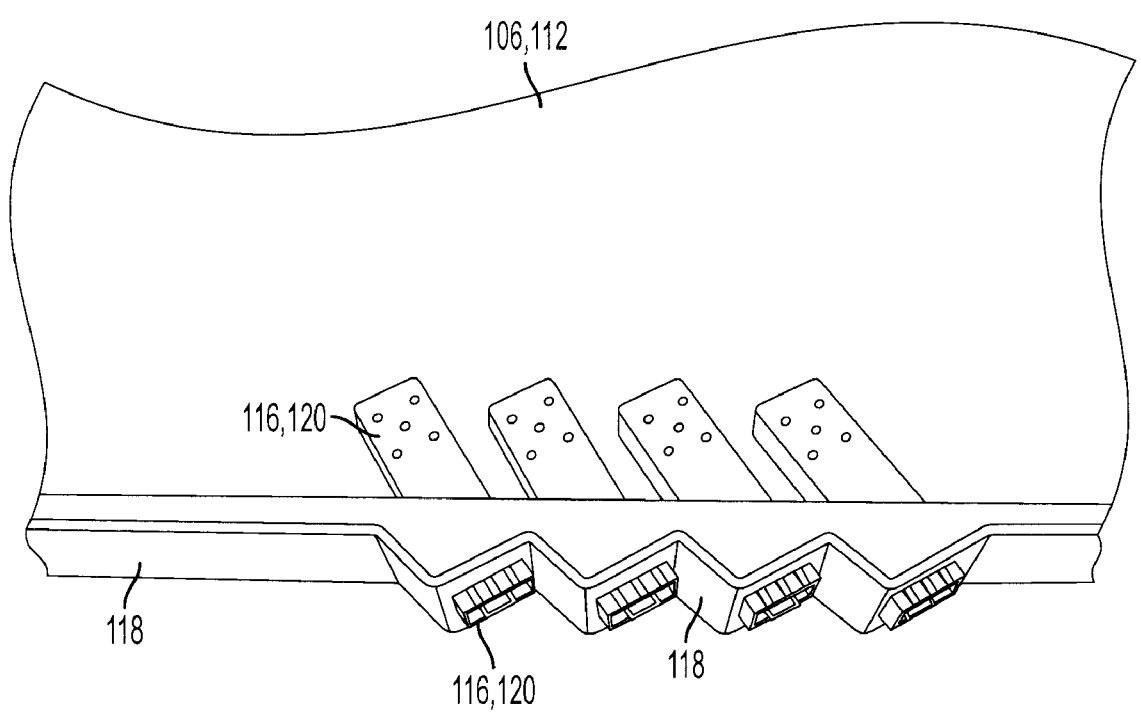
FIG. 5 is a perspective view showing a portion of the PCB of FIG. 1 including four separable portions, interface modules mounted on the separable portions, and a cover covering the separable portions, portions of the interface modules, and an edge portion of a main body of the PCB.

By virtue of the removability of tabs 104, PCB 100 is rendered adaptable or configurable for various different applications, i.e., applications requiring different numbers of interface modules 116 (see FIG. 5). PCB 100 may be manufactured so as to include a number of tabs 104 sufficient to accommodate as many interface modules 116 as are required for a range of possible applications. After manufacture of a PCB 100, tabs 104 provided thereon that are not needed for the particular application for which the given PCB 100 is dedicated may be removed. Accordingly, the manufacturing operations can be simplified since it is now possible to manufacture PCBs 100 destined for different applications using the same standard manufacturing operation rather than employing different customized manufacturing operations for the PCBs 100 destined for different applications. In addition, it now becomes possible to assign a PCB 100 to an application other than the application that was originally intended for it at the time of manufacture, thus adding flexibility and potentially reducing cost to the larger manufacturing operation of which manufacture of PCB 100 is a part.

When a PCB 100 is to be used for an application requiring fewer tabs than the number of tabs with which the PCB 100 is provided, the unneeded tabs 104 may be removed, as opposed to leaving them on the PCB 100 unused. Removing the unused tabs 104 would result in minimizing the space taken up by the PCB 100, which may reduce the cost of manufacturing the device of which the PCB 100 is a part.

FIG. 5 is a perspective view showing a portion of PCB 100 of FIG. 1 including four removable portions 104, interface modules 116 mounted on the removable portions 104, and a cover 118 covering the removable portions 104, portions of the interface modules 116, and a portion of edge 102 of main body 106 of PCB 100. Tabs 104 are used to support interface modules 116 that interface with PCB 100. The term "interface module" is to be understood in the broadest possible sense. According to an example embodiment of the invention, interface module 116 is a fiber optical port which may be used, e.g., to connect a fiber optic network or device to PCB 100. According to other example embodiments of the invention, interface module 116 may be any kind of connector, such as a mechanical connector or an electrical port. As shown in FIG. 5, interface module 116 may include a cage 120 or the like for housing its functional components. Interface module 116 may be physically mounted on tab 104 and extend from tab 104 onto main body 106 of PCB 100. For the physical mounting, holes 121 (see, e.g., FIG. 2) may be provided on tabs 104 for insertion therein of legs (not shown) of interface module 116. Appropriate connections, e.g., traces, pads, etc. may be provided on tab 104 and/or main body 106 for establishing an interface between interface module 116 and PCB 100. Details of interface module 116 and the manner in which it is supported by tab 104 and connected to main body 106 may be varied, as will be appreciated by those of skill in the art.

As described above, a cover 118 may be provided to cover edge 102 or a portion thereof, tabs 104 or portions thereof, and portions of interface modules 116 that are on tabs 104. (In FIG. 5, cover 118 extends substantially horizontally along the entire length of the illustrated portions of edge 102 and tabs 104.) Cover 118 may be attached to these covered portions by sealing it in the manner of a gasket. Cover 118 may serve, e.g., as a shield to reduce or prevent electromagnetic radiation exiting PCB 100 and/or interface modules 116, so as to reduce or eliminate electromagnetic interference. Additional shielding of this type may be provided, e.g., along the length of cover 118 on or above upper surface 112 of main body 106 of PCB 100. Cover 118 may also facilitate handling of PCB 100, e.g., cover 118 may be used as a grasping portion for the purpose of holding PCB 100 in place for performing procedures for mounting components on PCB 100. Cover 118 may also provide additional rigidity to PCB 100 and help hold it securely in place in the device of which it is a part. Details of cover 118, e.g., what portions are covered by it, the manner of attaching it to the covered portions, the functions it serves, and the manner and level of its performance of those functions, are variable, as will be understood by one of skill in the art in view of this description.

Returning to FIG. 1, shown to the left of tabs 104 in that figure, running along the left side of PCB 100, is protective portion 122. Protective portion 122 is commonly referred to as a break-away (portion). Protective portion 122 protects PCB 100, e.g., in shipping, and may also be used as a grasping portion for the purpose of holding PCB 100 for performing procedures for mounting components on PCB 100. Protective portion 122 is removably affixed to PCB 100 by means of perforated portions 124 (shown also in FIGS. 2 and 3). Reference numeral 126 represents a gap (open space) separating protective portion 122 and PCB 100 (as noted, PCB 100 includes both main body 106 and tabs 104; reference numeral 126 is shown at two different locations in FIG. 5 as a reminder of this point). Gap 126 extends along the left side, as shown in FIG. 1, of main body 106 of PCB 100, being interrupted at perforated portions 124, and changing its course at tabs 104 so as to extend along the left side of tabs 104, i.e., along the portion of the perimeter of tabs 104 that does not border main body 106 or, in other words, along the two shorter sides of each of the triangle-shaped tabs 104. After use, protective portion 122 is removed from PCB 100 by breaking the points of connection therebetween constituted by perforated portions 124. The configuration and design of protective portion 122, including the mechanism by which protective portion 122 is attached to and removed from PCB 100, may be varied as will be understood by those of skill in the art in view of this description.

Tabs 104 may be formed of the same material as that used for forming main body 106 of PCB 100, or from different materials. Where tabs 104 are formed integrally with main body 106, it may be convenient and cost efficient to form both of the same material.

The details of the present invention as described above and illustrated in the accompanying figures are to be taken as examples and not as limiting. It is understood that to the extent any details pertinent to the invention are omitted herein, they are known to those of skill in the art.

One of ordinary skill in the art will realize that modifications and variations, including but not limited to those discussed above, are possible within the spirit and scope of the present invention. The invention is intended to be limited in scope only by the accompanying claims, which should be accorded the broadest interpretation so as to encompass all such modifications, equivalent structures and functions.

What is claimed is:

1. A printed circuit board comprising:
    a main body; and
    at least one support portion, removably mechanically coupled to the main body and configured to support at least one interface module arranged to interface with at least one component of the main body while the support portion is mechanically coupled to the main body, and wherein the interface module is not interfaced with the at least one component of the main body when the support portion is not mechanically coupled to the main body.

2. The printed circuit board according to claim 1, wherein the at least one support portion extends from an edge portion of the main body.

3. The printed circuit board according to claim 1, wherein the at least one support portion is disposed between the main body and a protective portion.

4. The printed circuit board according to claim 1, wherein the at least one support portion is at least substantially triangular in shape.

5. The printed circuit board according to claim 1, wherein the printed circuit board further comprises a scored portion at a boundary between the main body and the at least one support portion.

6. The printed circuit board according to claim 1, wherein the at least one support portion is removable by being broken off from the main body at a scored portion between the at least one support portion and the main body.

7. The printed circuit board according to claim 1, wherein the at least one support portion is configured to mount with the at least one interface module.

8. The printed circuit board according to claim 1, wherein the at least one support portion is configured to support an electronic interface between each interface module and the main body of the printed circuit board.

9. The printed circuit board according to claim 8, wherein the interface is a fiber optic interface.

10. The printed circuit board according to claim 1, wherein an edge portion of the main body and at least a portion of the at least one support portion is covered with a cover.

11. The printed circuit board according to claim 1, wherein the interface module is a fiber optic module.

12. A method of configuring a printed circuit board, comprising:
    providing a printed circuit board comprised of a main body and at least one support portion, removably mechanically coupled to the main body and configured to support at least one interface module arranged to interface with at least one component of the main body while the support portion is mechanically coupled to the main body, and wherein the interface module is not interfaced with the at least one component of the main body when the support portion is not mechanically coupled to the main body; and
    removing the at least one support portion from being mechanically coupled to the main body.

13. The method of configuring a printed circuit board, according to claim 12, wherein the printed circuit board further includes:
    a scored portion at which the at least one support portion can be removed from being mechanically coupled to the main body.

14. The method according to claim 12, wherein the interface module is a fiber optic module.

15. A printed circuit board comprising:
    a main body portion;
    a support portion removably mechanically coupled to the main body portion and configured to support at least one interface module arranged to interface with at least one component of the main body portion; and a scored portion at a boundary between the main body portion and the support portion.

16. The printed circuit board according to claim 15, wherein the support portion is removably mechanically coupled to the main body portion at the scored portion.

17. The printed circuit board according to claim 16, wherein the support portion is removable by being broken off from the main body portion at the scored portion.

18. The printed circuit board according to claim 15, wherein the support portion is disposed between the main body portion and a protective portion.

19. The printed circuit board according to claim 15, wherein the support portion can support or have mounted thereon the at least one interface module.

20. The printed circuit board according to claim 19, wherein the support portion is configured to permit the interface module to interface with the at least one component of the main body portion.

21. The printed circuit board according to claim 15, wherein the interface module is a fiber optic module.

* * * * *